(12) United States Patent
Chen et al.

(10) Patent No.: US 10,762,957 B2
(45) Date of Patent: Sep. 1, 2020

(54) TWO-DIMENSIONALLY ACCESSIBLE NON-VOLATILE MEMORY

(71) Applicant: UNIVERSITY OF PITTSBURGH—OF THE COMMONWEALTH SYSTEM OF HIGHER EDUCATION, Pittsburgh, PA (US)

(72) Inventors: Yiran Chen, Pittsburgh, PA (US); Zheng Li, Pittsburgh, PA (US); Hai Li, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 16/311,809

(22) PCT Filed: Jun. 28, 2017

(86) PCT No.: PCT/US2017/039613
§ 371 (c)(1),
(2) Date: Dec. 20, 2018

(87) PCT Pub. No.: WO2018/005572
PCT Pub. Date: Jan. 4, 2018

(65) Prior Publication Data
US 2019/0206487 A1    Jul. 4, 2019

Related U.S. Application Data

(60) Provisional application No. 62/357,051, filed on Jun. 30, 2016.

(51) Int. Cl.
*G11C 11/00*    (2006.01)
*G11C 13/00*    (2006.01)
(Continued)

(52) U.S. Cl.
CPC .......... *G11C 13/003* (2013.01); *G11C 7/1075* (2013.01); *G11C 8/10* (2013.01);
(Continued)

(58) Field of Classification Search
CPC .............. G11C 13/003; G11C 13/0002; G11C 13/0023; G11C 8/10; G11C 13/0007;
(Continued)

(56) References Cited

U.S. PATENT DOCUMENTS 4,845,669 A    7/1989    Chappell et al.
6,314,042 B1*   11/2001   Tomishima .......... G11C 7/1006
                                                     365/230.03
(Continued)

OTHER PUBLICATIONS

Chen, Yen-Hao, et al., "Dual-addressing memory architecture for two-dimensional memory access patterns," Design, Automation & Test in Europe Conference & Exhibition, IEEE, 2013.
(Continued)

*Primary Examiner* — Tha-O H Bui
(74) *Attorney, Agent, or Firm* — Eckert Seamans Cherin & Mellott, LLC; Philip E. Levy

(57) ABSTRACT

A two-dimensional accessible non-volatile memory apparatus includes an array comprising a plurality of non-volatile memory cells, the array being a crossbar-based non-volatile memory structure, the memory cells being arranged in a plurality of rows and a plurality of columns. The apparatus further includes row read/write circuitry coupled to the array and structured and configured to provide read and write access to the memory cells in any one of the rows on an individual row basis, and column read/write circuitry coupled to the array and structured and configured to provide read and write access to the memory cells in any one of the columns on an individual column basis.

4 Claims, 4 Drawing Sheets

(51) Int. Cl.
*G11C 8/16* (2006.01)
*G11C 7/10* (2006.01)
*G11C 8/10* (2006.01)
*G11C 8/12* (2006.01)

(52) U.S. Cl.
CPC ............ *G11C 8/16* (2013.01); *G11C 13/0002* (2013.01); *G11C 13/004* (2013.01); *G11C 13/0007* (2013.01); *G11C 13/0023* (2013.01); *G11C 13/0026* (2013.01); *G11C 13/0028* (2013.01); *G11C 13/0069* (2013.01); *G11C 8/12* (2013.01); *G11C 2213/77* (2013.01)

(58) Field of Classification Search
CPC ..... G11C 7/1075; G11C 8/16; G11C 13/0069; G11C 13/004; G11C 13/0028; G11C 13/0026; G11C 2213/77; G11C 8/12
USPC .......................................................... 365/148
See application file for complete search history.

(56) References Cited

U.S. PATENT DOCUMENTS

| | | | |
|---|---|---|---|
| 6,449,205 B1* | 9/2002 | Chou .................... | G11C 11/406 365/189.05 |
| 6,603,688 B2* | 8/2003 | Hasegawa ................ | G11C 7/18 365/200 |
| 8,190,808 B2 | 5/2012 | Lai et al. | |
| 9,025,365 B2 | 5/2015 | Perner | |
| 9,305,607 B2 | 4/2016 | Zhao et al. | |
| 2007/0153620 A1 | 7/2007 | Kang | |
| 2012/0193602 A1 | 8/2012 | Lieber et al. | |
| 2013/0121075 A1* | 5/2013 | Hutchison ........... | G11C 11/5628 365/185.11 |
| 2014/0014891 A1 | 1/2014 | Perner | |
| 2014/0098619 A1* | 4/2014 | Nazarian ............ | G11C 13/0007 365/189.011 |

OTHER PUBLICATIONS

Seo, Jae-sun, et al., "A 45 nm CMOS neuromorphic chip with a scalable architecture for learning in networks of spiking neurons," Custom Integrated Circuits Conference (CICC), IEEE, 2011.

Kuk-Hwan Kim et al. "A Functional Hybrid Memristor Crossbar-Array/CMOS System for Data Storage and Neuromorphic Applications," Nano Letters, 2012, 12, 389-395.

Yen-Hao Chen et al., "Dual-addressing Memory Architecture for Two-dimensional Memory Access Patterns," 978-3-9815370-0-0/DATE13/c 2013 EDAA.

Jae-Sun Seo et al., "A 45nm CMOS Neuromorphic Chip with a Scalable Architecture for Learning in Networks of Spiking Neurons," 978-1-4577-0223-5/11/$26.00 © 2011 IEEE.

* cited by examiner

TWO-DIMENSIONALLY ACCESSIBLE NON-VOLATILE MEMORY

CROSS-REFERENCE TO RELATED APPLICATIONS

This application is a U.S. National Stage Application under 35 U.S.C. § 371 of PCT International Application No. PCT/US2017/039613, entitled "Two-Dimensionally Accessible Non-Volatile Memory," filed on Jun. 28, 2017, which claims priority under 35 U.S.C. § 119(e) from U.S. provisional patent application No. 62/357,051, entitled "Two-Dimensional Accessible Non-Volatile Memory," filed on Jun. 30, 2016, the contents of which are incorporated herein by reference.

GOVERNMENT CONTRACT

This invention was made with government support under grant # CNS-1253424 and grant # ECCS-1202225 awarded by the National Science Foundation (NSF). The government has certain rights in the invention.

BACKGROUND OF THE INVENTION

1. Field of the Invention

The present invention relates to non-volatile memory systems, and, in particular, to a dual-addressable non-volatile memory architecture that facilitates and enables both row-oriented and column-oriented data access.

2. Description of the Related Art

With the increasing capacity and the dropping price of dynamic random access memory (DRAM) modules, memory systems capable of storing huge amounts of data have become affordable. An in-memory database (IMDB) is a database system that stores a significant part, if not the entirety, of data in the main memory of a computer device to achieve high query performance. Compared with traditional disk-based databases, which only buffer small portions of data in main memory, an IMDB primarily relies on main memory for data storage. Since an IMDB nearly eliminates the I/O bottleneck between a fast RAM and a slow disk, a considerable performance gain can be expected.

Conventionally, database workloads are categorized into on-line transactional processing (OLTP) and on-line analytical processing (OLAP). OLTP workloads are characterized by a mix of reads and writes to a few rows of the database at a time, which is often latency-critical. On the contrary, OLAP applications are characterized by bulk sequential scans spanning a few columns of the database, such as computing aggregate values of specific columns. However, conventional DRAM-based main memory is optimized for row-oriented accesses generated by OLTP workloads in row-based databases. OLAP queries scanning on specified columns cause so-called strided accesses and result in poor memory performance. Since memory access latency dominates in IMDB processing time, it can degrade overall performance significantly.

SUMMARY OF THE INVENTION

In one embodiment, a two-dimensional accessible non-volatile memory apparatus is provided that includes an array comprising a plurality of non-volatile memory cells, the array being a crossbar-based non-volatile memory structure, the memory cells being arranged in a plurality of rows and a plurality of columns. The apparatus further includes row read/write circuitry coupled to the array and structured and configured to provide read and write access to the memory cells in any one of the rows on an individual row basis, and column read/write circuitry coupled to the array and structured and configured to provide read and write access to the memory cells in any one of the columns on an individual column basis.

In another embodiment, a memory access method is provided. The method includes providing a non-volatile memory apparatus comprising an array comprising a plurality of non-volatile memory cells, the array being a crossbar-based non-volatile memory structure, the memory cells being arranged in a plurality of rows and a plurality of columns, enabling read and write access to the memory cells in any one of the rows on an individual row basis, and enabling read and write access to the memory cells in any one of the columns on an individual column basis.

In yet another embodiment, a method of accessing a non-volatile memory apparatus comprising an array comprising a plurality of non-volatile memory cells, the array being a crossbar-based non-volatile memory structure, the memory cells being arranged in a plurality of rows and a plurality of columns, is provided. The method includes reading first data from or writing second data to the memory cells in one of the rows, and reading third data from or writing fourth data to the memory cells in one of the columns.

In still another embodiment, a method of making a two-dimensional accessible non-volatile memory apparatus is provided. The method includes providing an array comprising a plurality of non-volatile memory cells, the array being a crossbar-based non-volatile memory structure, the memory cells being arranged in a plurality of rows and a plurality of columns. The method further includes coupling row read/write circuitry to the array, the row read/write circuitry being structured and configured to provide read and write access to the memory cells in any one of the rows on an individual row basis, and coupling column read/write circuitry coupled to the array, the column read/write circuitry being structured and configured to provide read and write access to the memory cells in any one of the columns on an individual column basis.

DETAILED DESCRIPTION OF EXEMPLARY EMBODIMENTS

Figure 1:
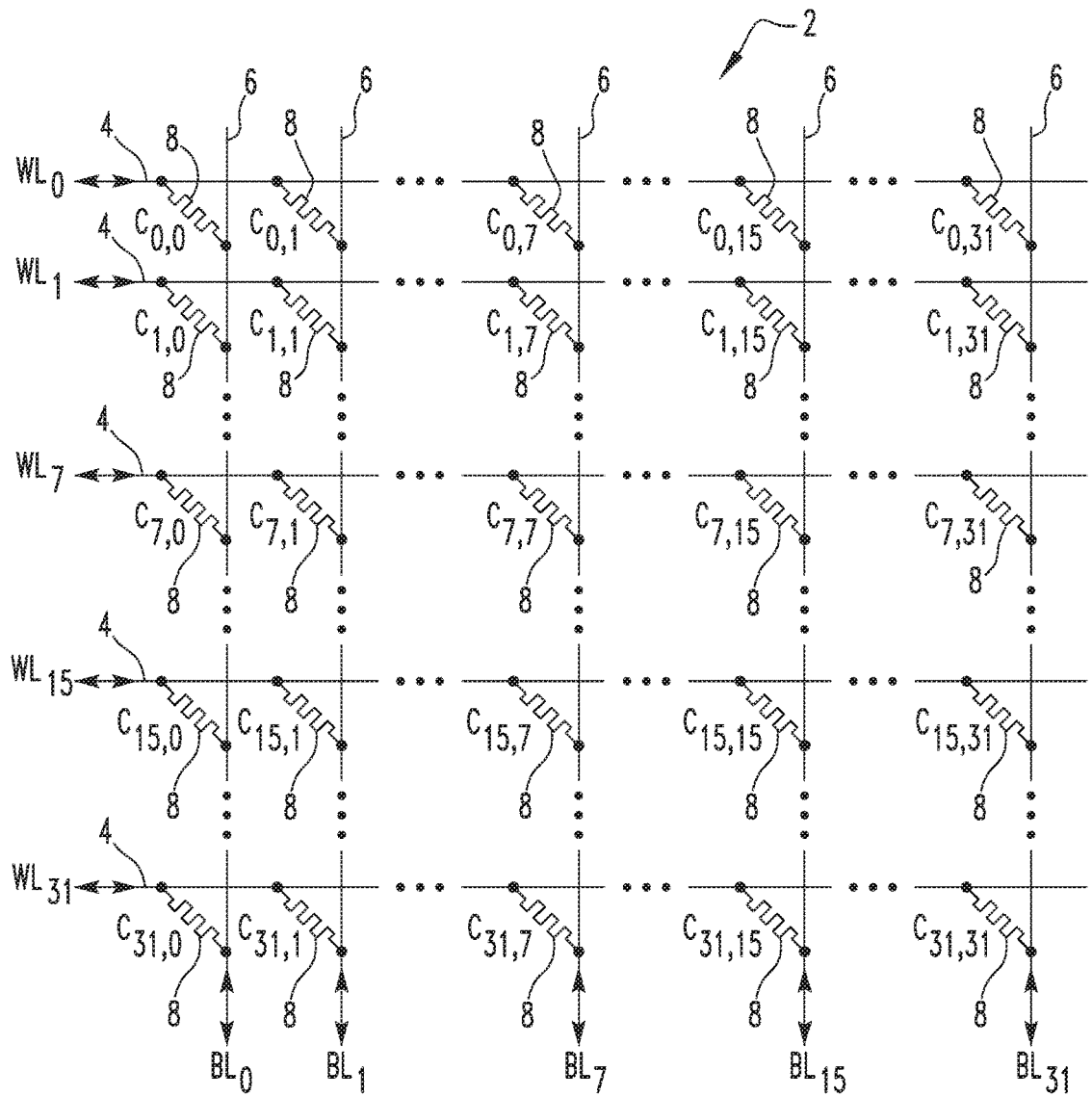
FIG. 1 is a schematic diagram of a prior art RRAM type crossbar-based nonvolatile memory structure that may be used to implement a two-dimensionally accessible memory in accordance with one non-limiting exemplary embodiment of the disclosed concept.

As used herein, the singular form of "a", "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs.

As used herein, "directly coupled" means that two elements are directly in contact with each other.

As used herein, the term "number" shall mean one or an integer greater than one (i.e., a plurality).

As used herein, the term "crossbar-based non-volatile memory structure" shall mean a memory structure that includes a plurality of first conductors (typically referred to as word lines (WLs)) extending in a first direction, a plurality of second conductors (typically referred to as bit lines (BLs)) extending in a second direction that is transverse (typically orthogonal) to the first direction, and a plurality of non-volatile storage cells, wherein each non-volatile storage cell is located at a respective one of the cross-points of the first and second conductors. The non-volatile storage cells may, for example and without limitation, store data as programmable resistance rather than electric charge. Examples of crossbar-based non-volatile memory structures include, for example and without limitation, resistive random access memory (RRAM) (See FIG. 1 described below), phase-change random access memory (PCRAM), spin transfer torque random-access memory (STT-RAM), and 3D XPoint memory.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The disclosed concept will now be described, for purposes of explanation, in connection with numerous specific details in order to provide a thorough understanding of the subject invention. It will be evident, however, that the disclosed concept can be practiced without these specific details without departing from the spirit and scope of this innovation.

As described in greater detail herein, the disclosed concept provides a two-dimensionally accessible memory that employs a crossbar-based nonvolatile memory structure to facilitate and enable both row-oriented and column-oriented access to data in the memory. The memory of the disclosed concept utilizes the principle of spatial locality and improves access speed and area efficiency for two-dimensional access patterns. The two-dimensionally accessible memory of the disclosed concept is based on emerging non-volatile devices and requires no additional control devices and routing wires, such as additional access transistors and word/bit lines, which would be required for designs based on standard DRAM or static random access memory (SRAM) structures. The two-dimensionally accessible memory of the disclosed concept may be utilized in a wide variety of applications, such as, without limitation, IMDBs, embedded neural network systems, and hardware caches (e.g., CPU caches).

FIG. 1 is a schematic diagram of a known RRAM type crossbar-based nonvolatile memory structure 2 that may be used to implement the disclosed concept in accordance with one non-limiting exemplary embodiment of the disclosed concept. As is known in the art, RRAM is a type of non-volatile random-access memory that works by changing the resistance across a dielectric solid-state material often referred to as a memristor. Typically, a high resistance is used to represent a logic "0" and a low resistance is used to represent a logic "1" (although this may be reversed). The basic idea is that a dielectric, which is normally insulating, can be made to conduct through a filament or conduction path formed after application of a sufficiently high voltage (the conduction path can arise from different mechanisms, including vacancy or metal defect migration). Once the filament is formed, it may be reset (i.e., broken, resulting in higher resistance) or set (i.r., re-formed, resulting in lower resistance) by another voltage.

As seen in FIG. 1, RRAM type crossbar-based nonvolatile memory structure 2 is, in the illustrated example, a 32×32 crossbar array of RRAM that includes word lines (WLs) 4 and bit lines (BLs) 6 arranged in a crisscrossing array. In addition, RRAM type crossbar-based nonvolatile memory structure 2 includes a plurality of RRAM cells 8 (each comprising a memristor), wherein each RRAM cell 8 lies at the cross-point of a respective word line 4 and bit line 6. Without introducing access transistors, RRAM cells 8 are directly interconnected with word lines 4 and bit lines 6 via electrodes. Read and write operations can be performed by activating word lines 4 and bit lines 6 with corresponding voltages.

In particular, to read out a row in RRAM type crossbar-based nonvolatile memory structure 2, the target WL 4 will be driven to a read voltage $V_{read}$. The voltage of the rest of the WLs 4 is set to a read reference voltage $V_R$. In addition, the voltage of BLs 6 is kept at $V_R$, which results in the voltage across the unselected RRAM cells 8 being equal to zero. Thus, the measured sensing current on each BL 6 will be exactly the same as the current flowing through the accessed RRAM cells 8. Since WLs 4 and BLs 6 are symmetric in the crossbar array of RRAM type crossbar-based nonvolatile memory structure 2, reading out a column can be realized by simply exchanging behaviors of WLs 4 and BLs 6. Thus, in FIG. 1, the voltages on WLs 4 and BLs 6 just need to exchanged accordingly. Then, the current on each WL 4 is sensed to read out the target RRAM cells 8 on the target column.

Write operations require two steps to write a row in RRAM type crossbar-based nonvolatile memory structure 2. First, the target WL 4 and BLs 6 are tied to a write voltage $V_{write}$ (Gnd) and Gnd ($V_{write}$) for a SET (RESET) operation, respectively. Other WLs 4 and BLs 6 are biased with half of $V_{write}$. Second, the target WL 4 and BLs 6 are applied with Gnd ($V_{write}$) and $V_{write}$ (Gnd) for a RESET (SET) operation of the remaining RRAM cells 8 in the target row. Therefore, the write voltage $V_{write}$ is fully applied across the full-selected RRAM cell(s) 8. Other RRAM cells 8 sharing the activated WL 4 and BLs 6 also bear partial voltage across them. Similar to a read operation, the roles of BLs 6 and WLs 4 just need to be exchanged to write to a column.

An important observation from the discussion above is that there is no change required to RRAM type crossbar-based nonvolatile memory structure 2 to enable both row and column access because of the symmetry of RRAM cells 8. Thus, as compared to a DRAM structure, a significantly smaller area overhead can be achieved in the memory of the disclosed concept by employing RRAM type crossbar-based nonvolatile memory structure 2 (or another symmetric crossbar-based nonvolatile memory structure). As used herein, symmetry means that the data can be accessed through both of the two ports of the storage cell (e.g., resistive storage cell). In other words, data can be read out through a BL or a WL without modifying the array structure. For example, in an RRAM type cell, because the information is stored as resistance value, both ports can sense the resistance value. This is in contrast to CMOS-based DRAM or SRAM (which do not employ symmetric memory cells), wherein data is stored as electric charge, which can only read from a BL. As a result, additional cells and control circuitry would be required to read data from a WL in DRAM and SRAM architectures.

Figure 2:
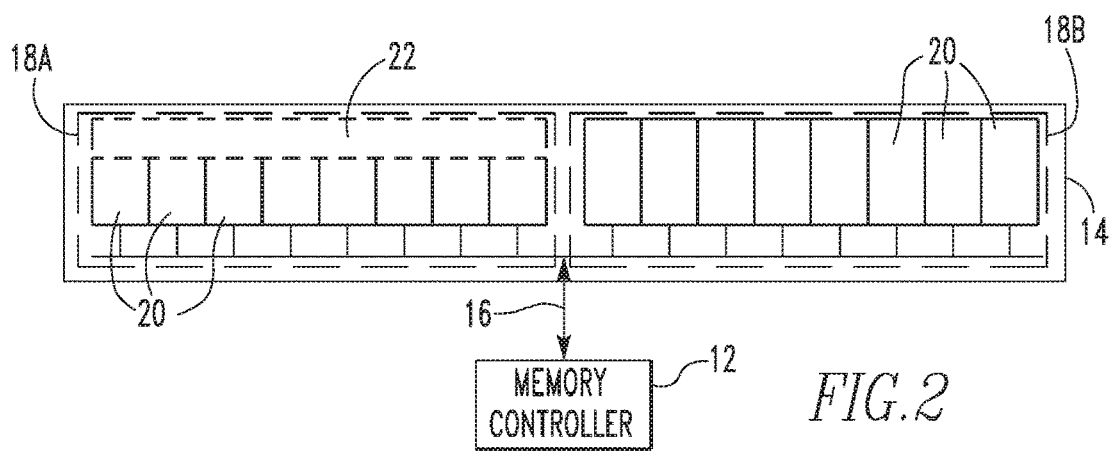
FIG. 2 is a schematic diagram of a row-column nonvolatile memory (RC-NVM) architecture according to a non-limiting exemplary embodiment of the disclosed concept.

FIG. 2 is a schematic diagram of a row-column nonvolatile memory (RC-NVM) architecture 10 according to a non-limiting exemplary embodiment of the disclosed concept. As described in greater detail herein, RC-NVM architecture 10 comprises a dual-addressable memory architecture that facilitates and enables both row-oriented and column-oriented data access. In the illustrated exemplary embodiment, RC-NVM 10 includes a memory controller 12, a dual in-line memory module (DIMM) device 14, and a memory bus 16 coupled to memory controller 12 and DIMM device 14 to enable memory controller 12 to access and control DIMM device 14. DIMM device 14 includes a first rank 18A and a second rank 18B. Each rank 18 includes a plurality of RC-NVM chips 20. In the illustrated embodiment, first rank 18A and second rank 18B each include eight RC-NVM chips 20. Each RC-NVM chip 20 employs a crossbar-based non-volatile memory structure having symmetric non-volatile storage cells as described in greater detail herein.

Furthermore, as illustrated schematically in FIG. 2, first rank 18A and second rank 18B each include a number of banks 22. Each bank 22 is a logical unit of storage of RC-NVM 10, and includes multiple rows and columns of storage cells spread over several RC-NVM chips 20. In the illustrated exemplary embodiment, each bank 22 is spread over eight RC-NVM chips 20.

Figure 3:
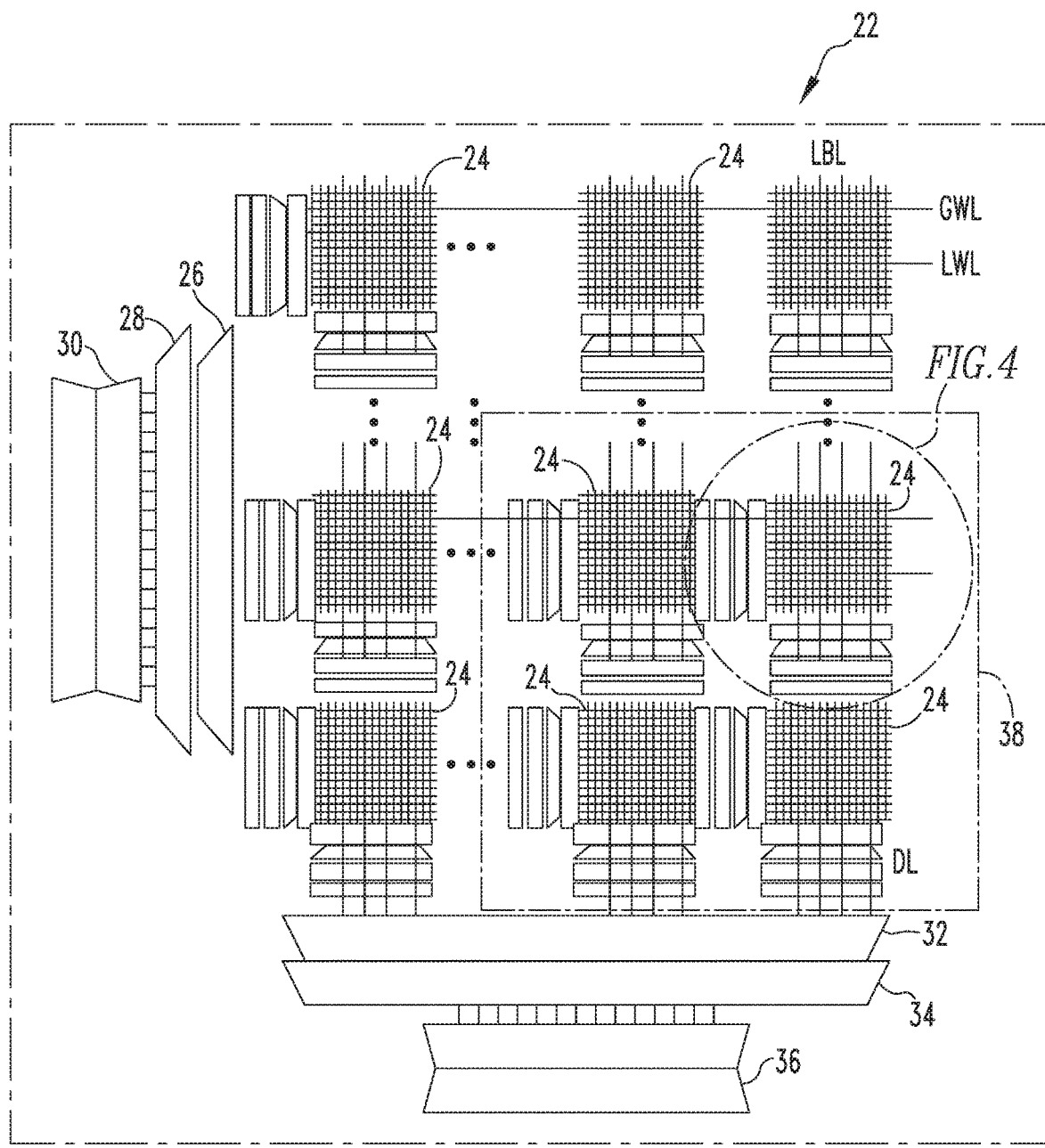
FIG. 3 is a schematic diagram of a bank forming a part of the RC-NVM architecture of FIG. 2 according to a non-limiting, exemplary embodiment.

FIG. 3 is a schematic diagram of bank 22 according to a non-limiting, exemplary embodiment of the disclosed concept. As seen in FIG. 3, bank 22 includes a plurality of mat assemblies 24 (described in detail herein) arranged in an array format. In addition, bank 22 includes a global column multiplexer 26, a global column decoder 28 coupled to global column multiplexer 26, and a global column buffer 30 coupled to the global column decoder 28. Similarly, bank 22 includes a global row multiplexer 32, a global row decoder 34 coupled to global row multiplexer 32, and a global row buffer 36 coupled to the global row decoder 34.

Moreover, as illustrated in FIG. 3, in bank 22, mat assemblies 24 are grouped into a plurality of logic structures referred to as subarrays 38 (only one being shown in FIG. 3 for ease of illustration). Each subarray 38 thus logically comprises a number of mat assemblies 24 and, according to an aspect of one exemplary embodiment of the disclosed concept, functions as the basic access unit for both row-oriented and column-oriented access to data within bank 22.

Figure 4:
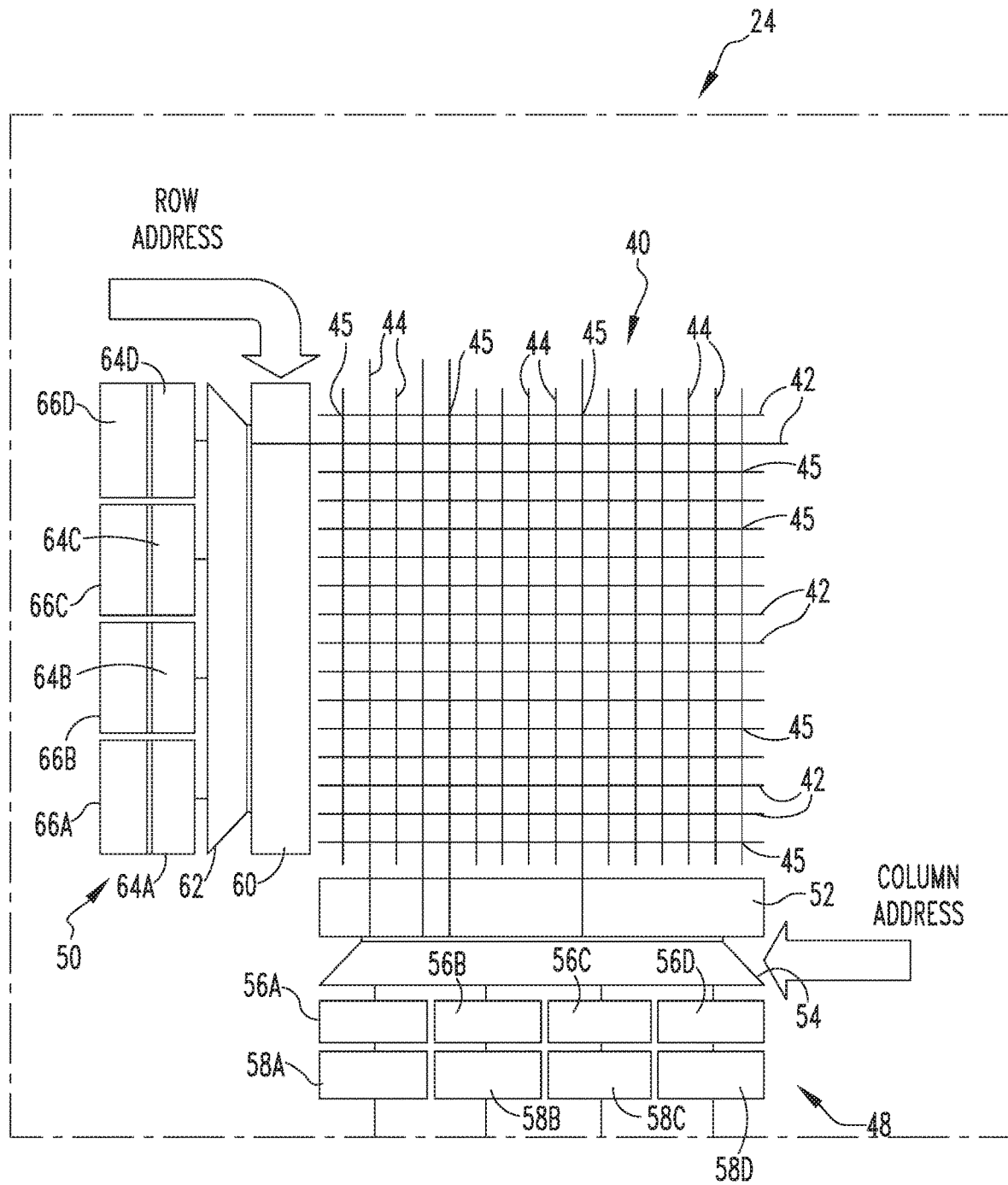
FIG. 4 is a schematic diagram of a mat assembly forming a part of the RC-NVM architecture of FIG. 2 according to an exemplary embodiment of the disclosed concept.

FIG. 4 is a schematic diagram of mat assembly 24 according to an exemplary embodiment of the disclosed concept. Mat assembly 24 includes a memory array 40 which is in form of a crossbar-based non-volatile memory structure. In the non-limiting exemplary embodiment, memory array 40 is a RRAM type crossbar-based nonvolatile memory structure similar to RRAM type crossbar-based nonvolatile memory structure 2, except that in the illustrated embodiment, it is a 16×16 crossbar array. Thus, memory array 40 in this illustrated embodiment includes sixteen word lines 42, sixteen bit lines 44, and 256 RRAM cells 45 located at the cross-points of word lines 42 and bit lines 44. Memory array 40 is thus able to store 256 bits of data in sixteen rows and sixteen columns (each row and each column including 16 bits (2 bytes) of data).

In addition, as seen in FIG. 4, mat assembly 24 includes local column read/write circuitry 48 for providing individual column-based read and write access to memory array 40 and local row read/write circuitry 50 for providing individual row-based read and write access to memory array 40. In particular, local column read/write circuitry 48 includes a local column decoder 52 coupled to bit lines 44, a local column multiplexer 54 coupled to local column decoder 52, sense amplifiers 56A, 56B, 56C and 56D coupled to a local row multiplexer 54, and write drivers 58A, 58B, 58C and 58D coupled to local column multiplexer 54. Similarly, local row read/write circuitry 50 includes a local row decoder 60 coupled to word lines 42, a local row multiplexer 62 coupled to local row decoder 60, sense amplifiers 64A, 64B, 64C and 64D coupled to a local row multiplexer 62, and write drivers 66A, 66B, 66C and 66D coupled to local row multiplexer 62.

Thus, by operation of local column read/write circuitry 48 (under control of memory controller 12), and in particular sense amplifiers 56A, 56B, 56C and 56D, the data stored in the RRAM cells 45 of any particular row in memory array 40 can be accessed and read and ultimately output to global row buffer 36 of bank 22. In addition, by operation of local column read/write circuitry 48 (under control of memory controller 12), and in particular write drivers 58A, 58B, 58C and 58D, data provided to global row buffer 36 of bank 22 may be stored in the RRAM cells 45 of any particular row in memory array 40. In the illustrated exemplary embodiment, since only four sense amplifiers 56A, 56B, 56C and 56D and four write drivers 58A, 58B, 58C and 58D are provided and coupled to bit lines 44, in order to read/write all sixteen RRAM cells 45 in any particular row, the reading/writing must be done over four read/write cycles. It will be understood that this is meant to be exemplary only, and that more or less sense amplifiers 56 and/or write drivers 58 may be provided within the scope of the disclosed concept to enable reading and/or writing of rows over more or less (e.g., one) cycles.

Column-based reading and writing is performed in a similar manner. Specifically, by operation of local row read/write circuitry 50 (under control of memory controller 12), and in particular sense amplifiers 64A, 64B, 64C and 64D, the data stored in the RRAM cells 45 of any particular column in memory array 40 can be accessed and read and ultimately output to global column buffer 30 of bank 22. In addition, by operation of local row read/write circuitry 50 (under control of memory controller 12), and in particular write drivers 66A, 66B, 66C and 66D, data provided to global column buffer 30 of bank 22 may be stored in the RRAM cells 45 of any particular column in memory array 40. In the illustrated exemplary embodiment, since only four sense amplifiers 64A, 64B, 64C and 64D and four write drivers 66A, 66B, 66C and 66D are provided and coupled to word lines lines 42, in order to read/write all sixteen RRAM cells 45 in any particular column, the reading/writing must be done over four read/write cycles. Again, it will be understood that this is meant to be exemplary only, and that more or less sense amplifiers 64 and/or write drivers 66 may be provided within the scope of the disclosed concept to enable reading and/or writing of columns over more or less (e.g., one) cycles.

For illustrative purposes, an exemplary row read will now be described to explain the operational scheme of RC-NVM architecture 10. First, an address signal is received from memory controller 12 which identifies the target row to be read. After receiving the address signal from memory controller 12, global column decoder 28 activates the target mat assembly 24 by asserting corresponding global word line (GWL) and global block line (GBL) to high. Thereafter, the nonvolatile memory cells on selected local bit lines are sensed out. Sense amplifiers 56 transfer data to global row buffer 36 through data lines.

RC-NVM architecture 10 thus provides a transposable, dual-addressable memory architecture wherein data may be accessed (read and/or written) in both a row-oriented and a column-oriented manner.

Figure 5:
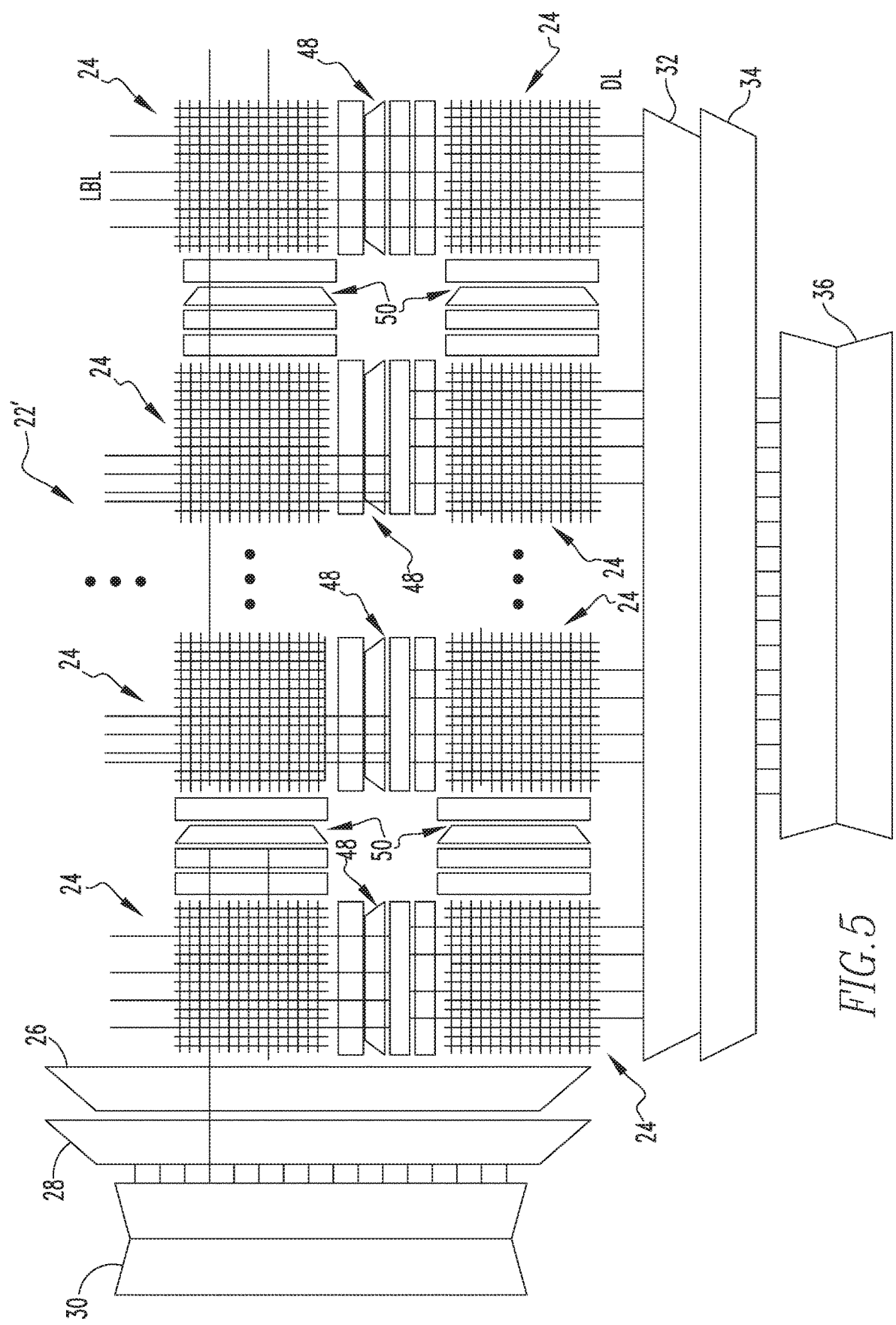
FIG. 5 is a schematic diagram of an alternative bank forming a part of the RC-NVM architecture of FIG. 2 according to an alternative non-limiting, exemplary embodiment

FIG. 5 is a schematic diagram of a bank 22' according to an alternative non-limiting, exemplary embodiment that may be used in RC-NVM architecture 10 in place of bank 22. Bank 22' is similar to bank 22 and like components are labeled with like reference numerals. However, as seen in FIG. 5, bank 22' includes mat assemblies 24 wherein local column read/write circuitry 48 and/or local row read/write circuitry 50 are shared among mat assemblies 24. In particular, in the exemplary embodiment, for area efficiency, each local column read/write circuitry 48 and/or local row read/write circuitry 50 is shared by two adjacent mat assemblies 24. In all other respects, operation of bank 22' is similar to operation of bank 22.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A two-dimensional accessible non-volatile memory apparatus, comprising:
  a plurality of non-volatile memory chips;
  a bank, wherein the bank is a logical unit of storage spread across the plurality of non-volatile memory chips, wherein the bank includes a global row buffer, a global column buffer, and a plurality of mat assemblies arranged in an array format, wherein each mat assembly comprises an array comprising a plurality of non-volatile memory cells, the array being a crossbar-based non-volatile memory structure, wherein the mat assemblies are grouped into a plurality of rows and a plurality of columns, wherein the mat assemblies are grouped into a plurality of subarrays each in the form of a logic structure, wherein each subarray logically includes a plurality of the mat assemblies;
  row read/write circuitry, wherein the row read/write circuitry is associated with a particular one of the subarrays and is coupled to and shared by a first two or more of the plurality of the mat assemblies of the particular one of the subarrays and is structured and configured to provide read and write access to the memory cells in any one of the rows of the first two or more of the plurality of the mat assemblies on an individual row basis to enable output of data stored in the any one of the rows to the global row buffer; and
  column read/write circuitry, wherein the column read/write circuitry is associated with the particular one of the subarrays and is coupled to and shared by a second two or more of the plurality of the mat assemblies of the particular one of the subarrays and is structured and configured to provide read and write access to the memory cells in any one of the columns of the second two or more of the plurality of the rear assemblies on an individual column basis to enable output of data stored in the any one of the columns to the global column buffer.

2. The two-dimensional accessible non-volatile memory apparatus according to claim 1, wherein the row read/write circuitry includes a number of first sensing amplifiers and a number of first write drivers and the column read/write circuitry includes a number of second sensing amplifiers and a number of second write drivers.

3. The two-dimensional accessible non-volatile memory apparatus according to claim 2, wherein the row read/write circuitry further includes a first decoder and a first multiplexer, and wherein the column read/write circuitry includes a second decoder and a second multiplexer each.

4. The two-dimensional accessible non-volatile memory apparatus according to claim 1, wherein the array is a RRAM type crossbar-based nonvolatile memory structure.

* * * * *

UNITED STATES PATENT AND TRADEMARK OFFICE
CERTIFICATE OF CORRECTION

PATENT NO. : 10,762,957 B2  
APPLICATION NO. : 16/311809  
DATED : September 1, 2020  
INVENTOR(S) : Yiran Chen, Zheng Li and Hai Li Page 1 of 1

It is certified that error appears in the above-identified patent and that said Letters Patent is hereby corrected as shown below:

In the Claims

Column 8, Lines 9-14:
"non-volatile memory structure, wherein the mat assemblies are grouped into a plurality of rows and a plurality of columns, wherein the mat assemblies are grouped into a plurality of subarrays each in the form of a logic structure, wherein each subarray logically includes a plurality of the mat assemblies;"

Should read:
-- non-volatile memory structure, the memory cells being arranged in a plurality of rows and a plurality of columns, wherein the mat assemblies are grouped into a plurality of subarrays each in the form of a logic structure, wherein each subarray logically includes a plurality of mat assemblies; --

Column 8, Line 32:
"two or more of the plurality of the rear assemblies"

Should read:
-- two or more of the plurality of the mat assemblies --

Signed and Sealed this  
Twenty-third Day of November, 2021

Drew Hirshfeld  
*Performing the Functions and Duties of the*  
*Under Secretary of Commerce for Intellectual Property and*  
*Director of the United States Patent and Trademark Office*